US010992303B2

(12) United States Patent
Wang et al.

(10) Patent No.: US 10,992,303 B2
(45) Date of Patent: Apr. 27, 2021

(54) LOW-POWER, LOW-NOISE MILLIMETER WAVELENGTH FREQUENCY SYNTHESIZER

(71) Applicant: The Regents of the University of California, Oakland, CA (US)

(72) Inventors: Hao Wang, Davis, CA (US); Omeed Momeni, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 16/896,866

(22) Filed: Jun. 9, 2020

(65) Prior Publication Data

US 2020/0403620 A1 Dec. 24, 2020

Related U.S. Application Data

(60) Provisional application No. 62/863,413, filed on Jun. 19, 2019.

(51) Int. Cl.
*H03L 7/095* (2006.01)
*H03L 7/093* (2006.01)
(Continued)

(52) U.S. Cl.
CPC ............... *H03L 7/095* (2013.01); *H03L 7/07* (2013.01); *H03L 7/0802* (2013.01); *H03L 7/091* (2013.01);
(Continued)

(58) Field of Classification Search
CPC ... H03L 7/091; H03L 7/07; H03L 7/20; H03L 7/095; H03L 2207/14; H03L 7/0802
See application file for complete search history.

(56) References Cited

U.S. PATENT DOCUMENTS

| 7,606,343 B2 * | 10/2009 | Nauta | H03L 7/197 |
| | | | 375/226 |
| 9,197,224 B2 * | 11/2015 | Kinget | H03L 7/087 |
| 10,541,689 B1 * | 1/2020 | Chang | H03L 7/07 |

OTHER PUBLICATIONS

Gao, Xiang, Eric Klumperink, and Bram Nauta. "Sub-sampling PLL techniques." 2015 IEEE Custom Integrated Circuits Conference (CICC). IEEE, 2015. (Year: 2015).*

* cited by examiner

*Primary Examiner* — Ryan Johnson
(74) *Attorney, Agent, or Firm* — Park, Vaughan, Fleming & Dowler LLP

(57) ABSTRACT

The system includes an intermediate-frequency (IF) synthesizer that generates an IF signal based on a reference signal, and a sub-sampling PLL (SSPLL) that generates a high-frequency output signal based on an input. A switch selects either the reference signal or the IF signal to be the input to the SSPLL. When the reference signal is the input to the SSPLL, the frequency synthesizer operates in a low-noise normal-operating mode, and when the IF signal is the input to the SSPLL, the frequency synthesizer operates in a higher-noise, frequency-acquisition mode. A sub-sampling lock detector (SSLD) determines whether the frequency synthesizer becomes unlocked during the normal-operating mode, and if so, activates the switch to move the system into the frequency-acquisition mode. It also determines whether the frequency synthesizer becomes relocked to the target frequency during the frequency-acquisition mode, and if so, activates the switch to move the system into the normal-operating mode.

20 Claims, 10 Drawing Sheets

(51) Int. Cl.
   *H03L 7/08*   (2006.01)
   *H03L 7/091*  (2006.01)
   *H03L 7/20*   (2006.01)
   *H03L 7/07*   (2006.01)
(52) U.S. Cl.
   CPC ............... *H03L 7/093* (2013.01); *H03L 7/20*
       (2013.01); *H03L 2207/14* (2013.01)

LOW-POWER, LOW-NOISE MILLIMETER WAVELENGTH FREQUENCY SYNTHESIZER

CROSS-REFERENCE TO RELATED APPLICATION

This application claims the benefit of U.S. Provisional Patent Application Ser. No. 62/863,413, entitled "Low-Power and Low-Noise Millimeter-Wave Sub-Sampling Phase-Locked Loop with a Sub-Sampling Lock Detector," by inventors Hao Wang and Omeed Momeni, Attorney Docket Number UC19-553-1PSP, filed on 19 Jun. 2019, the contents of which are incorporated by reference herein.

GOVERNMENT LICENSE RIGHTS

This invention was made with U.S. government support under grant number 1562208 awarded by the National Aeronautics and Space Administration (NASA) Jet Propulsion Laboratory (JPL). The U.S. government has certain rights in the invention.

BACKGROUND

Field

The disclosed embodiments generally relate to the design of frequency synthesizers. More specifically, the disclosed embodiments relate to the design of a low-power, low-noise millimeter wavelength frequency synthesizer, comprising a sub-sampling phased-locked loop with a sub-sampling lock detector to facilitate automatic frequency locking.

Related Art

Frequency synthesizers are widely used to support diverse applications in telecommunication systems, computer systems and a variety of other electronic systems. A number of frequency synthesizer designs have been developed to provide on-chip millimeter wavelength frequency synthesis. The most straightforward design, which is illustrated in FIG. 1A, uses a conventional phase-locked loop (PLL) to multiply a reference frequency $f_{ref}$ by a multiplication factor M to produce an output frequency $f_{out}=M \times f_{ref}$. Unfortunately, in this design, reference phase noise combined with noise arising from the phase frequency detector (PFD) 102, the charge-pump (CP) 104 and the loop filter (LF) 106 are amplified at the output by a factor of $M^2$, which means the resulting output signal $f_{out}$ 108 can be extremely noisy.

The sub-sampling PLL (SSPLL) design illustrated in FIG. 1B significantly reduces in-band phase noise by making use of a sub-sampling phase detector (SSPD) 112, a charge pump 114 and a voltage-controlled oscillator (VCO) 116 to generate $f_{out}$ 117. However, this circuit intrinsically functions as a PLL rather than a frequency-locked loop. This means the circuit can improperly lock to any integer harmonic of $f_{ref}$. Hence, an additional frequency-locked loop (FLL) 118 is used to ensure a desired output frequency.

Both the conventional PLL illustrated in FIG. 1A and the SSPLL illustrated in FIG. 1B include frequency dividers. Because of constraints imposed by the limited transistor speeds in CMOS processes, "injection-locked" frequency dividers (ILFDs) 109 and 119 are used to facilitate operation at millimeter wavelengths. Unfortunately, ILFDs consume a significant amount of power due to their high operating frequencies; they also suffer from limited locking range.

To avoid using ILFDs for millimeter wavelength frequency synthesis, other frequency synthesizer designs have been developed. For example, FIG. 1C illustrates a "cascaded PLL" design. In this design, a first-stage conventional PLL 122 is used to generate an intermediate frequency (IF) 124, which is scaled up to a higher output frequency $f_{out}$ 126 using an SSPLL 127. Because the frequency divider 128 in the first-stage conventional PLL 122 operates at a relatively low frequency, it can be fabricated using digital circuitry, which means that the resulting power consumption is relatively low. Frequency acquisition is achieved by setting the IF 124 higher than the millimeter wavelength tuning range of VCO 129. This means the SSPLL 127 can only lock to one frequency, which is a specific harmonic of IF 124. Although SSPLL 127's noise contribution is low, the first-stage conventional PLL 122 can generate significant residual noise. This residual noise can be minimized by carefully optimizing the first-stage convention PLL 122's bandwidth and the IF values. However, this optimization results in a relatively high IF 124, which increases the design complexity of the SSPD 125 and also increases total power consumption.

FIG. 1D illustrates another millimeter wavelength frequency synthesizer design, which makes use of injection-locking frequency multipliers (ILFMs). Like the cascaded PPL illustrated in FIG. 1C, a first-stage conventional PLL 132 is used to generate an IF 134, which feeds into an ILFM chain 136 that includes one or more ILFMs, to produce a millimeter wavelength output frequency $f_{out}$ 138, which is an integer multiple of IF 134. When properly locked, the ILFMs 136 do not add much noise themselves; they simply upscale the IF 134 signal's phase noise due to frequency multiplication. Hence, using the ILFMs 136 is advantageous because of their low-noise performance. However, like ILFDs 109 and 119 illustrated in FIGS. 1A and 1B, the ILFMs 136 suffer from limited locking range.

Hence, what is needed is a millimeter wavelength frequency synthesizer design that does not suffer from the above-mentioned drawbacks of existing designs.

SUMMARY

The disclosed embodiments relate to a system that implements a frequency synthesizer. The system includes an intermediate-frequency (IF) synthesizer that generates an IF signal based on a reference signal. It also includes a sub-sampling phase-locked loop (SSPLL) that generates a high-frequency output signal based on an input signal. The system additionally includes a switch that selects either the reference signal or the IF signal to be the input signal to the SSPLL, wherein when the reference signal is the input signal to the SSPLL, the frequency synthesizer operates in a low-noise normal-operating mode in which the frequency synthesizer can become unlocked from a desired target frequency, and when the IF signal is the input signal to the SSPLL, the frequency synthesizer operates in a higher-noise, frequency-acquisition mode in which the frequency synthesizer automatically locks to the target frequency. Finally, the system includes a sub-sampling lock detector (SSLD), which is configured to determine whether the frequency synthesizer becomes unlocked from the target frequency during the normal-operating mode, and if so, to activate the switch to move the frequency synthesizer into the frequency-acquisition mode. It is also configured to determine whether the frequency synthesizer becomes relocked to the target frequency during the frequency-acquisition mode, and if so, to activate the switch to move the frequency synthesizer into the normal-operating mode.

In some embodiments, the SSLD determines a locking status of the frequency synthesizer. While doing so, the SSLD samples the SSPLL output using the IF signal to produce a detection signal, and then measures a frequency of the detection signal. Next, the SSLD determines the locking status of the frequency synthesizer based on the frequency of the detection signal.

In some embodiments, the locking status can indicate one of the following: the SSPLL output signal is properly locked to a harmonic of the IF signal; the SSPLL output signal is improperly locked to a harmonic of the reference signal, which is not a harmonic of the IF signal; and the SSPLL output signal is not locked to any signal.

In some embodiments, the SSLD is configured to operate with reference to the IF signal and thereby consumes less power than a comparable circuit that operates at a higher frequency.

In some embodiments, the IF synthesizer comprises a phase-locked loop (PLL).

In some embodiments, the PLL includes a forward path, which feeds the reference signal through a phase-frequency detector (PFD) to produce an error signal, wherein a charge pump converts the error signal into a voltage, which feeds through a loop filter and is used to tune a voltage-controlled oscillator to produce the IF signal. It also includes a feedback path, which feeds the IF signal through a frequency divider to produce a feedback signal. During operation, the PFD compares the reference signal against the feedback signal to produce the error signal.

In some embodiments, the SSPLL includes a forward path, which feeds the IF signal through a sub-sampling phase detector (SSPD) to produce an error signal, wherein a charge pump converts the error signal into a voltage, which feeds through a loop filter and is used to tune a voltage-controlled oscillator to produce the high-frequency output signal. During operation, the SSPD samples the reference signal using the high-frequency output signal to produce the error signal.

In some embodiments, the frequency of the IF signal is sufficiently high to ensure that the SSPLL can only lock to one frequency (the target frequency) which is an integer multiple of the IF.

In some embodiments, the SSLD uses a pseudo-digital state machine, which includes digital circuitry but is not driven by an external clock, to control activation of the switch.

In some embodiments, the switch comprises a multiplexer.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

DISCUSSION

Figure 1A:
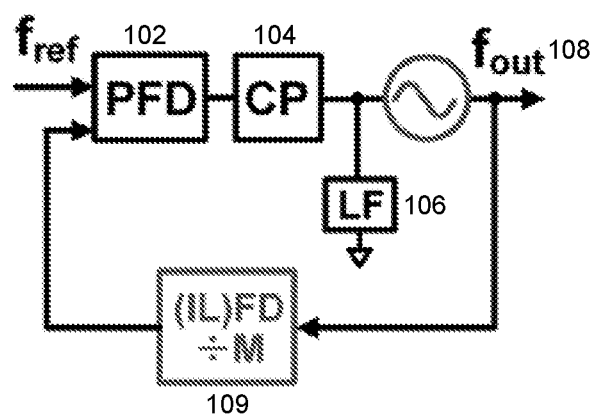
FIG. 1A presents a block diagram for a frequency synthesizer based on a PLL.
Figure 1B:
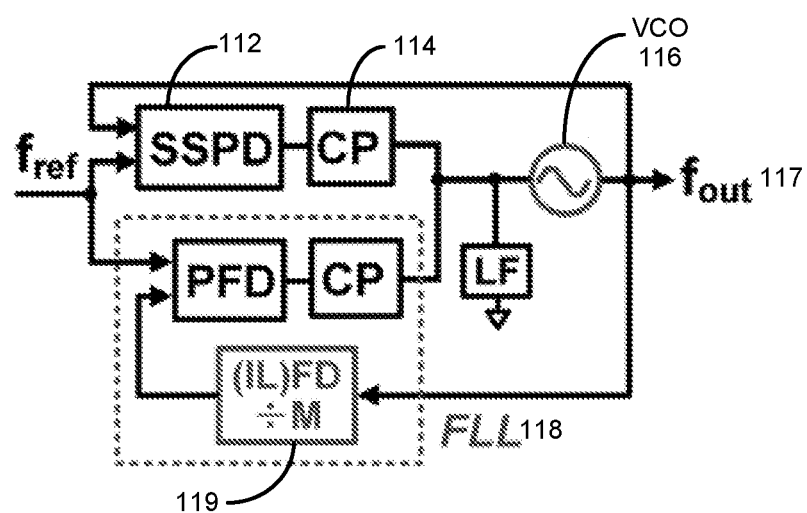
FIG. 1B presents a block diagram for a frequency synthesizer based on an SSPLL.
Figure 1C:
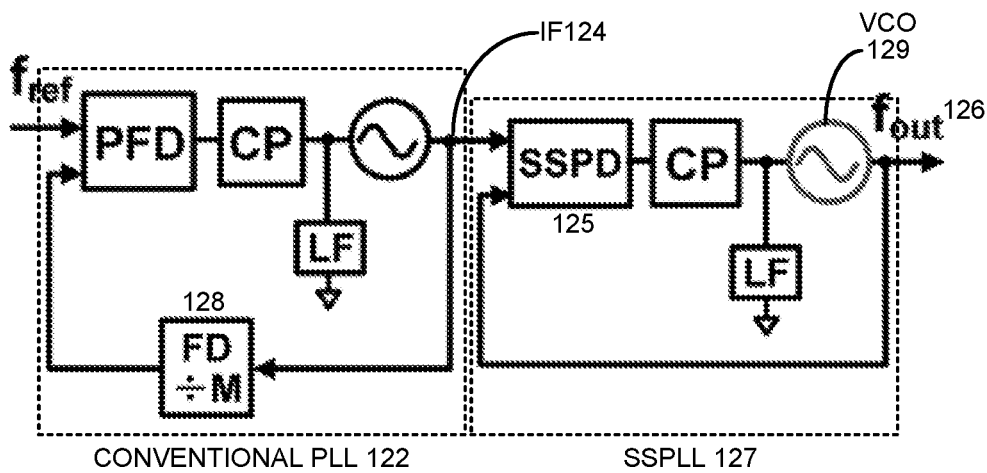
FIG. 1C presents a block diagram for a frequency synthesizer based on a cascaded PLL.
Figure 1D:
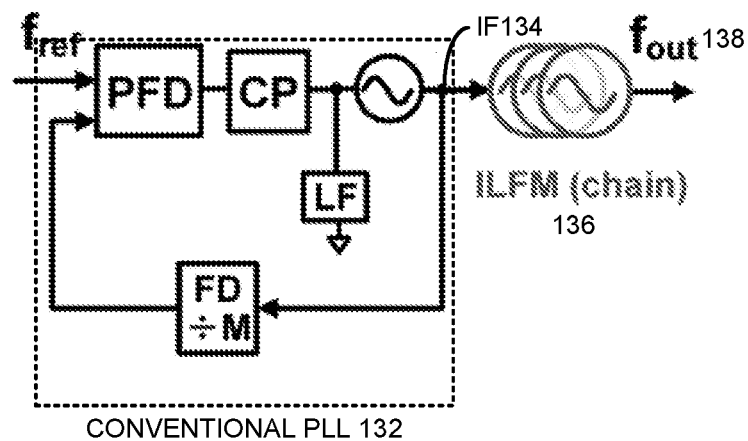
FIG. 1D presents a block diagram for a frequency synthesizer based on a PLL and ILFMs.
Figure 2:
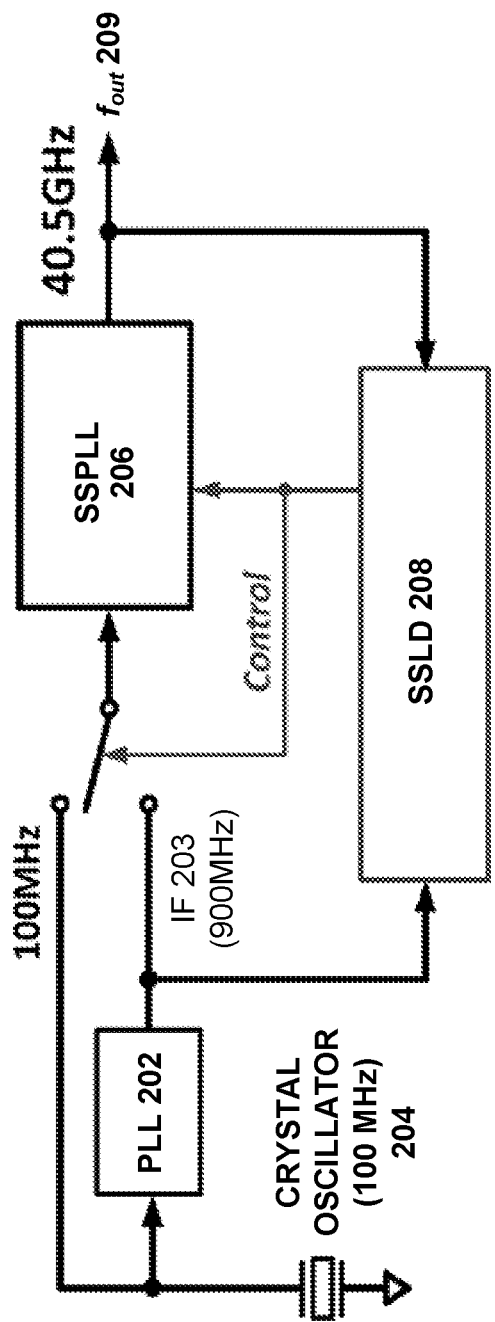
FIG. 2 presents a block diagram for a frequency synthesizer based on an SSPLL that uses an SSLD to facilitate automatic frequency locking in accordance with the disclosed embodiments.

A conceptual diagram of our proposed millimeter wavelength frequency synthesizer is illustrated in FIG. 2. Note that a low-frequency conventional PLL 202 is used to generate a 900 MHz IF signal 203 from a 100 MHz reference signal obtained from a crystal oscillator 204. This IF signal 203 is used to frequency-lock the millimeter wavelength SSPLL 206, as well as to detect the locking status of SSPLL 206. When SSPLL 206 receives IF signal 203 as a reference frequency, the frequency synthesizer illustrated in FIG. 2 becomes a "cascaded PLL." Note that the 40.5 GHz VCO 302 (see FIG. 3) within SSPLL 206 is designed to have a frequency tuning range smaller than 900 MHz under any possible capacitor bank setup. Hence, after initial calibration, SSPLL 206 can only lock to one harmonic of 900 MHz at 40.5 GHz.

After frequency acquisition is achieved, SSPLL 206 will operate based on the 100 MHz crystal signal as a reference to benefit from its low phase noise. The reference switching process is automatic and is activated by sub-sampling lock detector (SSLD) 208. SSLD 208 uses 900 MHz IF signal 203 to sample the output of SSPLL 206 to detect whether SSPLL 206 is locked to 40.5 GHz. If the SSPLL 206 loses lock, or locks to a wrong 100 MHz harmonic (e.g. at 40.4 GHz), SSLD 208 will automatically switch SSPLL 206's input reference frequency to 900 MHz to facilitate frequency-acquisition. After SSPLL locks to 40.5 GHz, digital logic inside the SSLD 208 switches SSPLL 206's reference frequency back to 100 MHz and keeps monitoring the locking status. Hence, with the help of SSLD 208, our system achieves automatic lock detection and re-locking functionality.

Figure 3:
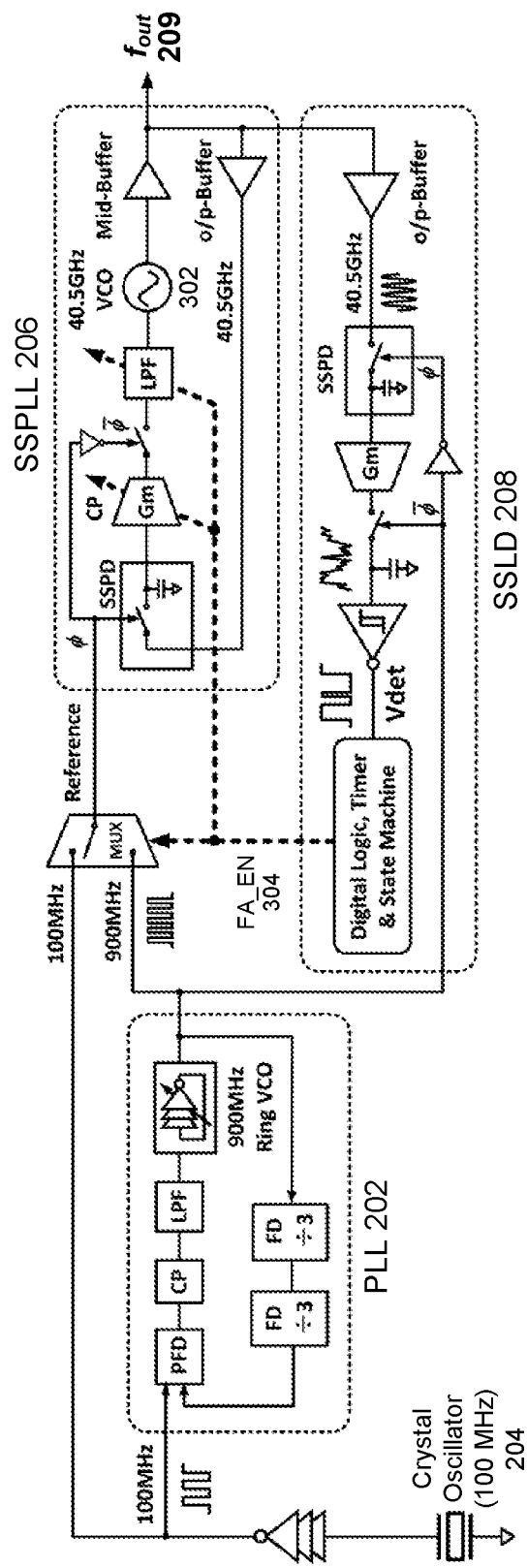
FIG. 3 presents a detailed diagram for the frequency synthesizer illustrated in FIG. 2 in accordance with the disclosed embodiments.

A more detailed diagram of our proposed frequency synthesizer is illustrated in FIG. 3. This system achieves low-noise and low-power millimeter wavelength frequency synthesis for the following reasons. First, PLL 202 operates at relatively low frequency. Also, because the IF value is not constrained by any noise-based optimization, it can be selected based on a millimeter wavelength VCO tuning range. Furthermore, because the 900 MHz reference frequency is connected to SSPLL 206 only during frequency acquisition, when SSPLL 206 switches its reference input to 100 MHz, the IF signal's phase noise does not affect the output of SSPLL 206. Hence, PLL 202's phase noise is only required to be low enough to suffice for SSLD 208's sampling operation, instead of very low for millimeter wavelength output noise optimization. For these reasons, PLL 202 can be designed to have low power consumption. Second, SSLD 208 is a relatively low-frequency block, which does not contains an ILFD or other power-hungry active components operating at millimeter wavelength frequencies. As can be seen in FIG. 3, and as explained below, most of the power consumed in SSLD 208 is due to its analog interface, which acts as a sampler switch, and an associated charge pump, which operates at 900 MHz. Consequently, the frequency synthesizer illustrated in FIG. 2 simultaneously benefits from the low in-band phase noise feature of SSPLL 206's structure, and also consumes a small amount of power because of relatively low-frequency and low-complexity auxiliary blocks.

Sub-Sampling Lock Detector

SSLD 208 is designed to detect whether SSPLL 206's output is locked to the correct frequency.

Sub-Sampling Analog Interface

Figure 4A:
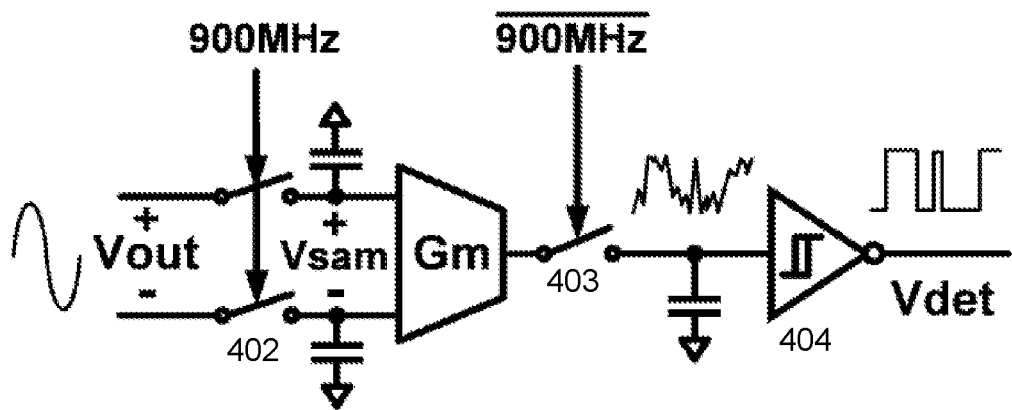
FIG. 4A illustrates a portion of an SSLD in accordance with the disclosed embodiments.

To examine whether an SSPLL output frequency $f_{out}$ is an integer multiple of 900 MHz, our system uses the 900 MHz IF signal 203 to sub-sample the output signal from SSPLL 206. FIG. 4A illustrates the input analog interface of SSLD 208. The sampling switches 402-403 produce an output $V_{sam}$, which is a semi-discrete signal that can be calculated as follows:

$$V_{sam}(n) = A_{sam} \sin\left(2\pi \frac{f_{out}}{900 \text{ MHz}} n + \phi_{sam}\right) \quad (1)$$

where n is an integer representing the $n^{th}$ sample, $A_{sam}$ is the amplitude, $\phi_{sam}$ is the random default phase of $V_{sam}$ and $f_{out}$ is the SSPLL output frequency. We then amplify $V_{sam}$ using a charge-pump with a small capacitive load, and rectify it with a Schmitt trigger 404 to produce a square-wave signal $V_{det}$, which is normalized to supply voltage. $V_{det}$ can be calculated as:

$$V_{det}(n) = \text{sign}\left\{\sin\left(2\pi \frac{f_{out}}{900 \text{ MHz}} n + \phi_{sam}\right)\right\} + 1 \quad (2)$$

Since $V_{det}$ is a discrete-time signal with a sampling rate of 900 MHz, its frequency shown in time-domain is restrained by the Nyquist sampling criteria of $f_{det}$<900 MHz/2. For example, $f_{det}$ is 100 MHz for all values of $f_{out}$=N*900 MHz+100 MHz; $f_{det}$ is also 100 MHz, instead of 800 MHz, for $f_{out}$=N*900 MHz-100 MHz, because of Nyquist sampling criteria. Hence, we can summarize the expression of $f_{det}$ as:

$f_{det}$=min{$f_{out}$ mod 900 MHz, 900 MHz-($f_{out}$ mod 900 MHz)} where "a mod b" is the remainder of a divided by b. We now examine $f_{det}$ values for three SSPLL lock states.

(1) SSPLL 206 Locks to a 900 MHz Harmonic:

In this case, SSPLL 206 locks to a 900 MHz harmonic, $f_{out}$=N*900 MHz, where N is an integer. Note that the sampled phase of SSPLL 206's output does not change with time. Hence, $V_{det}(n)$ becomes a stable value at either 0 or 1:

$$V_{det}(n) = \text{sign}\{\sin(\phi_{sam})\} + 1 \quad (3)$$

This means $V_{det}$ will not toggle when SSPLL 206 locks to any 900 MHz harmonic.

(2) SSPLL Locks to an Improper 100 MHz Harmonic:

When SSPLL 206 received the 100 MHz as reference input, it can improperly lock to a 100 MHz harmonic, which is not a 900 MHz harmonic. Hence, we have $f_{out}$=N*900 MHz+M*100 MHz, where N and M are integers and −4<M<+4. In this case, toggling frequency $f_{det}$=M*100 MHz.

(3) SSPLL Loses Lock:

When the SSPLL loses lock, $f_{out}$ is a random value between 100 MHz and 900 MHz harmonics. In this case, $V_{det}$ will toggle at random frequencies.

Figure 4B:
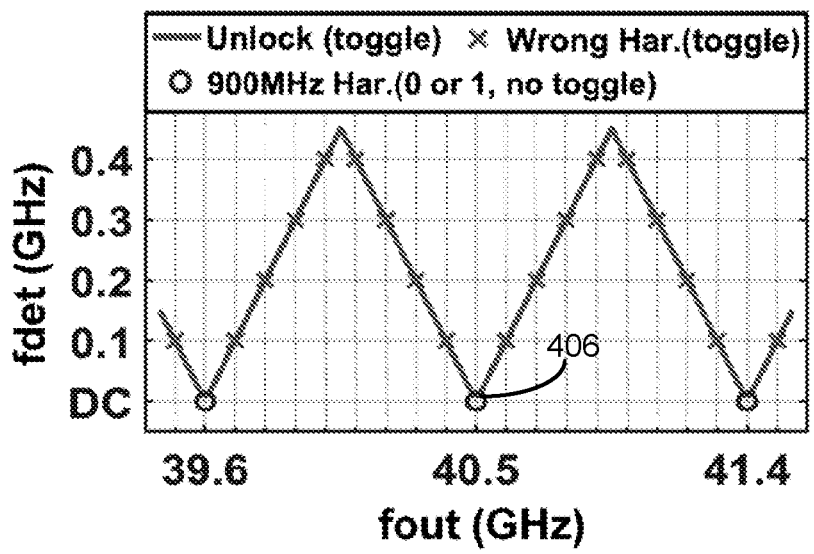
FIG. 4B presents a graph illustrating the relationship between a sampled waveform frequency $f_{det}$ and the input frequency for the SSLD in accordance with the disclosed embodiments.

The graph in FIG. 4B illustrates the abovementioned cases of the relationship between $f_{det}$ and $f_{out}$ with $f_{out}$ centered at the system's target frequency of 40.5 GHz. SSLD 208 is configured to cause the system to operate at circle 406, where $f_{out}$=40.5 GHz and $V_{det}$ does not toggle its value. Note that we can design the VCO 302 inside SSPLL 206 to have a less than 900 MHz tuning range for each possible capacitor bank setup, so that after initial calibration, 40.5 GHz will be the only possible 900 MHz harmonic that the system can lock to.

Figure 4C:
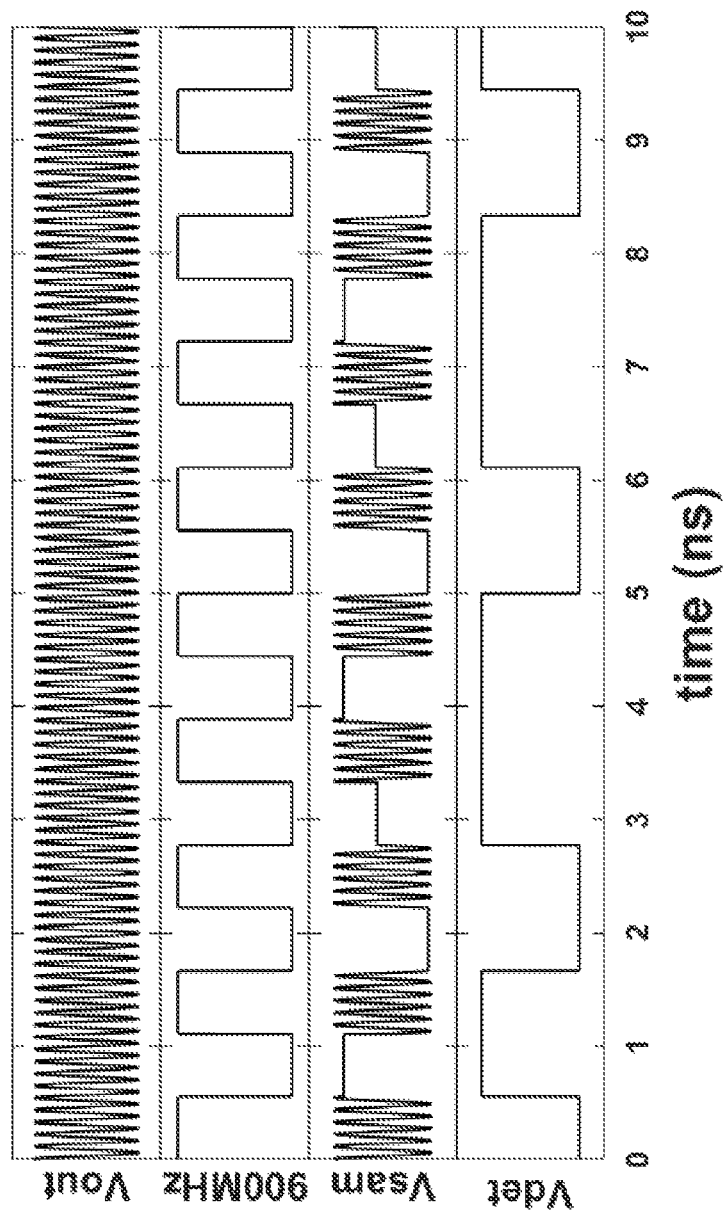
FIG. 4C illustrates exemplary waveforms for the SSLD in accordance with the disclosed embodiments.

FIG. 4C illustrates exemplary SSLD signals corresponding to case (2). For simplicity in plotting, $f_{out}$ was chosen to be 9.3 GHz, which is 300 MHz away from the closest 900 MHz harmonic. As can be deduced from FIG. 4B, we can verify that $V_{det}$ has a toggling frequency of 300 MHz.

However, due to circuit noise, the theoretical calculations described above may not actually appear in practice. Jitter in the 900 MHz signal $\sigma_{900\ MHz}$ together with the SSPLL 206's output phase noise $o_{PN}$ will induce a random phase error $\Delta\varphi(n)=2\pi f_{out}\sigma_{900\ MHz}(n)+\phi_{PN}(n)$ at each sampling moment. Hence, when the SSPLL 206 locks to a 900 MHz harmonic, $V_{det}$ in Eq. (3) becomes:

$$V_{det}(n)=\mathrm{sign}\{\sin(\phi_{sam}+\Delta\varphi(n))\}+1 \qquad (5)$$

Here, we reasonably assume that the 900 MHz jitter-induced phase error is significantly larger than $\phi_{PN}$. From Eq. (5) we observe that if $\sigma_{900\ MHz}$ is too large, $V_{det}$ may toggle stochastically even if SSPLL 206 has locked to a 900 MHz harmonic. Hence, we must ensure that the design of the PLL 202 produces a sufficiently low jitter (e.g. an RMS jitter of 1 ps). Fortunately, when observing the toggling frequency of $V_{det}(n)$, we only count the toggling number within a small time window (as explained below). Thus, because of the small time window, it is mainly the short-term or cycle-to-cycle jitter of the 900 MHz IF signal 203 that induces the phase error. Because this short-term jitter is mainly caused by the high frequency phase noise, by properly designing a high loop bandwidth PLL 202, we can achieve low short-term jitter by using a low-power and moderate-noise ring oscillator.

To verify the functionality of SSLD 208's analog interface, we measured a taped-out frequency synthesizer chip with an oscilloscope to produce $V_{det}$ waveforms at different $f_{out}$ values that are illustrated in FIG. 4C. In doing so, we manipulated the open-loop VCO 302 (see FIG. 3) with a control voltage to produce different $f_{out}$ values, which were buffered and fed into SSLD 208. We observe that: (1) when $f_{out}$=40.5 GHz, due to unstable open-loop VCO frequency and circuit noise, $f_{det}$ is not exactly DC, but toggles at a sufficiently low frequency; (2) when $f_{out}$ is at 40.6 GHz, 40.7 GHz and 40.9 GHz, although $f_{det}$ is not exactly as calculated as in FIG. 4B, it is near or above 100 MHz, which is sufficiently high for further signal processing in the digital logic circuitry.

From the above analysis, we can see that $V_{det}$ cannot accurately indicate how much $f_{out}$ deviates from a 900 MHz harmonic. However, note that the task of the SSLD 208 is merely to distinguish between two states of SSPLL 206: (1) locked to a 900 MHz harmonic; and (b) not locked a 900 MHz harmonic. Hence, if $V_{det}$ can toggle above a sufficiently high frequency when the SSPLL is not locked to a 900 MHz harmonic, we can use it to generate a control signal to initiate relocking. We next show how this is achieved.

Digital Logic and State Machine

Figure 5A:
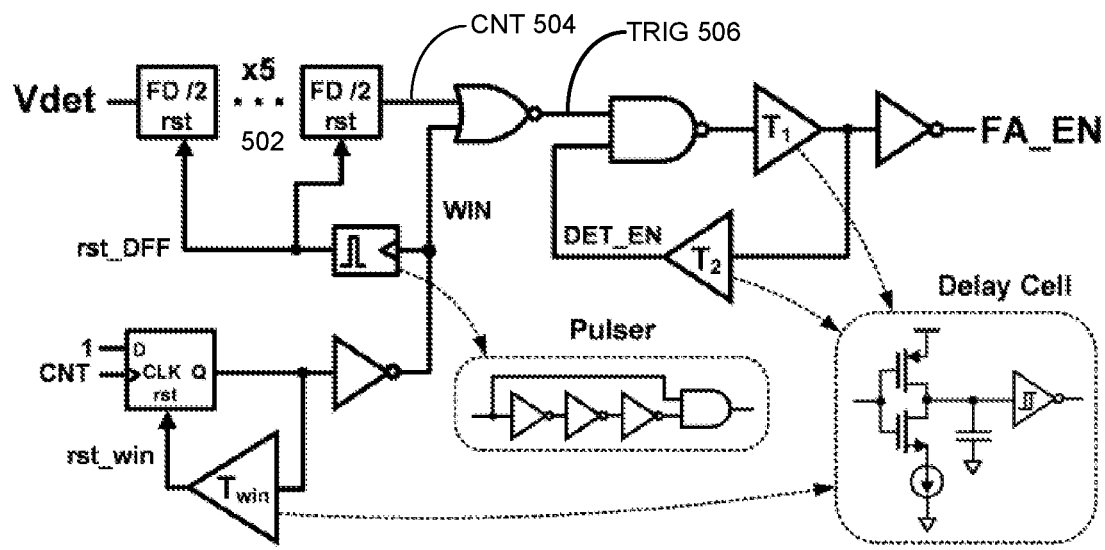
FIG. 5A illustrates digital circuitry that processes $V_{det}$ to produce a control signal to select the input for the SSPLL in the frequency synthesizer illustrated in FIG. 3 in accordance with the disclosed embodiments.

After producing the $V_{det}$ signal from the analog interface, we feed it into pseudo-digital circuitry for further processing and control signal generation. FIG. 5A illustrates exemplary pseudo-digital circuitry of this type inside SSLD 208. During operation of SSLD 208, the system first needs to determine whether SSPLL 206 is properly locked to a 900 MHz IF harmonic. As discussed previously, this is indicated by the $f_{det}$ value for two cases: (a) when SSPLL 206 locks to a 900 MHz harmonic, $f_{det}\ll 100$ MHz; and (b) when SSPLL 206 loses lock or locks to a wrong 100 MHz harmonic, $f_{det}\geq 100$ MHz. During operation, SSLD 208 first measures $f_{det}$ by counting rising edges of $V_{det}$ within a preset time window $T_{win}$. Referring to FIG. 5A, this is accomplished by feeding $V_{det}$ through a chain of resettable D flip-flop dividers 502 and checking the output signal CNT 504 at the end of the time window. In this implementation, $T_{win}$=200 ns and there are five dividers. Within $T_{win}$, the minimum $V_{det}$ rising edge number required to flip CNT from 0 to 1 is 17. This translates to a threshold toggling frequency of $f_{th}=(17-1)/T_{win}=80$ MHz. We also designed digital logic to generate an unlock-indicating signal TRIG 506. When $f_{det}\ll f_{th}$, SSPLL 206 is locked to a 900 MHz harmonic and TRIG 506 is 0. When $f_{det}>$fth, SSPLL 206 is not locked to a 900 MHz harmonic and TRIG 506 is 1. Note that the $f_{th}$ value can have a fairly wide range and does not need to be very accurate; it only needs to distinguish between two cases: (1) $f_{det}\ll 100$ MHz, and (2) $f_{det}\geq 100$ MHz. Also, depending on the amount of IF signal jitter and noise from other blocks, we can choose other values to fit a specific design.

Figure 5B:
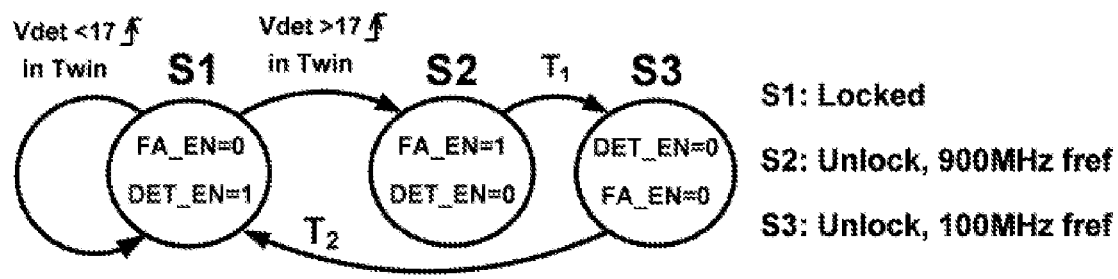
FIG. 5B presents a state machine for the digital circuitry illustrated in FIG. 5A in accordance with the disclosed embodiments.

Next, the pseudo-digital finite-state machine (FSM) shown in FIG. 5B generates a reference control signal FA_EN to facilitate SSPLL 206's frequency-acquisition and re-locking procedures. As shown in FIG. 3, the signal FA_EN 304 selects different references and loop configurations for the SSPLL 206. When FA_EN=0, SSPLL 206 takes 100 MHz as its reference for low-noise phase locking. In contrast, when FA_EN=1, SSPLL 206 takes 900 MHz as its reference for frequency-acquisition. Note that the DET_EN signal that appears in states S1, S2 and S3 enables the lock/unlock detection result to feed into the state machine.

Figure 5C:
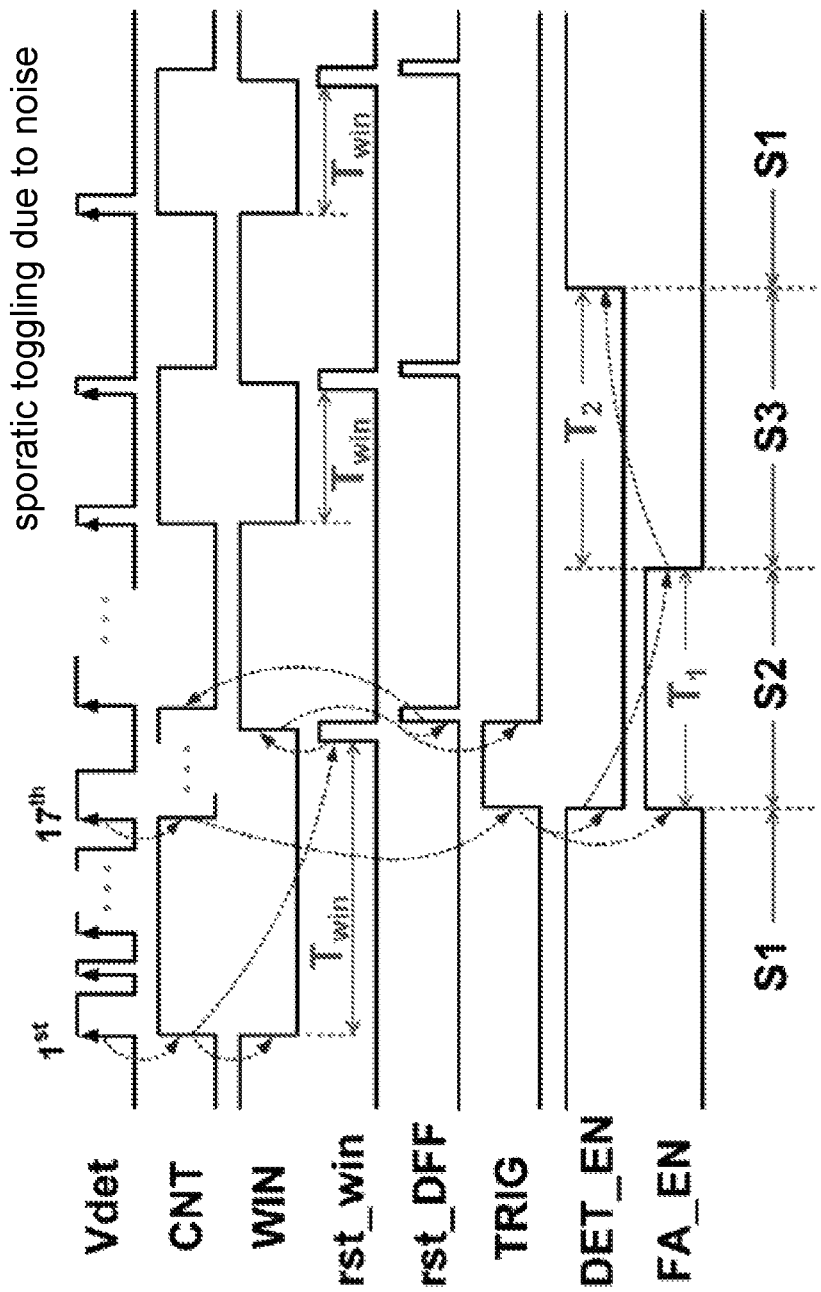
FIG. 5C presents a signal diagram for the digital circuitry illustrated in FIG. 5A in accordance with the disclosed embodiments.

SSLD 208's finite state machine (FSM) works as follows. State S1 corresponds to the desired case where SSPLL 206 locks to a 900 MHz harmonic. In this state, the SSPLL 206 takes 100 MHz as its reference and SSLD 208 continues detecting lock status. When an improper lock or an unlocked state for SSPLL 206 is detected, the FSM will enter state S2, wherein FA_EN is set to 1 to trigger SSPLL 206's frequency acquisition, and DET_EN is set to 0 to temporarily disable lock detection. The system then transitions to state S3 and then back to S1. The signal levels associated with this entire process are illustrated in FIG. 5C.

Process of Operation

Figure 6:
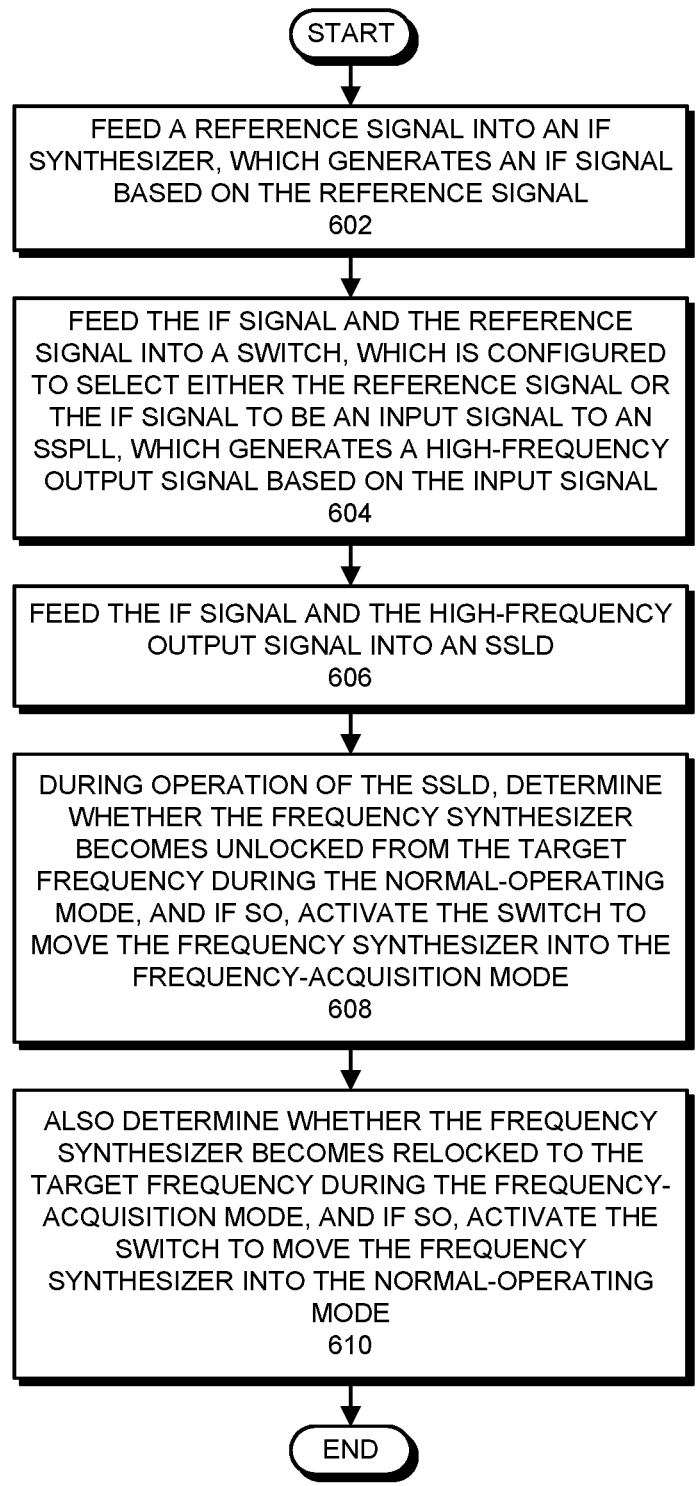
FIG. 6 presents a flow chart illustrating a process for operating a frequency synthesizer in accordance with the disclosed embodiments.

FIG. 6 presents a flow chart illustrating a process for operating a frequency synthesizer in accordance with the disclosed embodiments. The system first feeds a reference signal into an IF synthesizer, which generates an IF signal based on the reference signal (step 602). Next, the system feeds the IF signal and the reference signal into a switch, which is configured to select either the reference signal or the IF signal to be an input signal to an SSPLL, which generates a high-frequency output signal based on the input signal (step 604). Note that when the reference signal is the input signal to the SSPLL, the frequency synthesizer operates in a low-noise normal-operating mode in which the frequency synthesizer can become unlocked from a desired target frequency, and when the IF signal is the input signal to the SSPLL, the frequency synthesizer operates in a higher-noise, frequency-acquisition mode in which the frequency synthesizer automatically locks to the target frequency. The system also feeds the IF signal and the high-frequency output signal into a sub-sampling lock detector (SSLD) (step 606). During operation, the SSLD determines whether the frequency synthesizer becomes unlocked from the target frequency during the normal-operating mode, and if so, activates the switch to move the frequency synthesizer into the frequency-acquisition mode (step 608). The SSLD also determines whether the frequency synthesizer becomes relocked to the target frequency during the frequency-acquisition mode, and if so, activates the switch to move the frequency synthesizer into the normal-operating mode (step 610).

Figure 7:
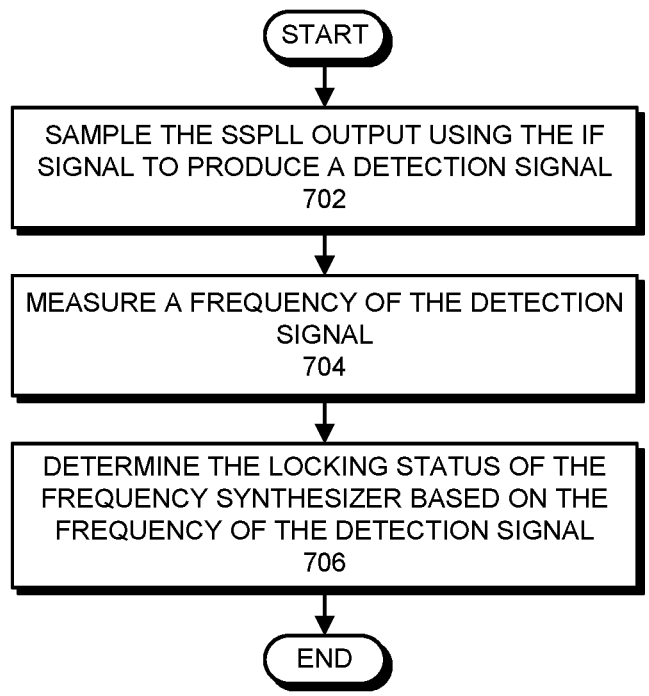
FIG. 7 presents a flow chart illustrating how the SSLD determines a locking status of the frequency synthesizer in accordance with the disclosed embodiments.

FIG. 7 presents a flow chart illustrating how the SSLD determines a locking status of the frequency synthesizer in accordance with the disclosed embodiments. During this process, the SSLD samples the SSPLL output using the IF signal to produce a detection signal (step 702), and measures a frequency of the detection signal (704). Next, the SSLD determines the locking status of the frequency synthesizer based on the frequency of the detection signal (step 706).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A system that implements a frequency synthesizer, comprising:
    an intermediate-frequency (IF) synthesizer that generates an IF signal based on a reference signal;
    a sub-sampling phase-locked loop (SSPLL) that generates a high-frequency output signal based on an input signal;
    a switch that selects either the reference signal or the IF signal to be the input signal to the SSPLL, wherein when the reference signal is the input signal to the SSPLL, the frequency synthesizer operates in a low-noise normal-operating mode in which the frequency synthesizer can become unlocked from a desired target frequency, and when the IF signal is the input signal to the SSPLL, the frequency synthesizer operates in a higher-noise, frequency-acquisition mode in which the frequency synthesizer automatically locks to the target frequency; and
    a sub-sampling lock detector (SSLD), which is configured to:
        determine whether the frequency synthesizer becomes unlocked from the target frequency during the normal-operating mode, and if so, to activate the switch to move the frequency synthesizer into the frequency-acquisition mode, and
        determine whether the frequency synthesizer becomes relocked to the target frequency during the frequency-acquisition mode, and if so, to activate the switch to move the frequency synthesizer into the normal-operating mode.

2. The system of claim 1, wherein the SSLD is configured to determine a locking status of the frequency synthesizer by:
    sampling the SSPLL output using the IF signal to produce a detection signal;
    measuring a frequency of the detection signal; and
    determining the locking status of the frequency synthesizer based on the frequency of the detection signal.

3. The system of 2, wherein the locking status can be one of the following:
    the SSPLL output signal is properly locked to a harmonic of the IF signal;
    the SSPLL output signal is improperly locked to a harmonic of the reference signal, which is not a harmonic of the IF signal; and
    the SSPLL output signal is not locked to any signal.

4. The system of claim 1, wherein the SSLD is configured to operate with reference to the IF signal and thereby consumes less power than a comparable circuit that operates at a higher frequency.

5. The system of claim 1, wherein the IF synthesizer comprises a phase-locked loop (PLL).

6. The system of claim 5, wherein the PLL comprises:
    a forward path, which feeds the reference signal through a phase-frequency detector (PFD) to produce an error signal, wherein a charge pump converts the error signal into a voltage, which feeds through a loop filter and is used to tune a voltage-controlled oscillator to produce the IF signal; and
    a feedback path, which feeds the IF signal through a frequency divider to produce a feedback signal;
    wherein during operation, the PFD compares the reference signal against the feedback signal to produce the error signal.

7. The system of claim 1, wherein the SSPLL comprises:
    a forward path, which feeds the IF signal through a sub-sampling phase detector (SSPD) to produce an error signal, wherein a charge pump converts the error signal into a voltage, which feeds through a loop filter and is used to tune a voltage-controlled oscillator to produce a high-frequency output signal;
    wherein during operation, the SSPD samples the reference signal using the high-frequency output signal to produce the error signal.

8. The system of claim 1, wherein the frequency of the IF signal is sufficiently high to ensure that the SSPLL can only lock to one frequency (the target frequency) which is an integer multiple of the IF.

9. The system of claim 1, wherein the SSLD uses a pseudo-digital state machine, which includes digital circuitry but is not driven by an external clock, to control activation of the switch.

10. The system of claim 1, wherein the switch comprises a multiplexer.

11. A method for operating a frequency synthesizer, comprising:
    feeding a reference signal into an intermediate-frequency (IF) synthesizer, which generates an IF signal based on the reference signal;
    feeding the IF signal and the reference signal into a switch, which is configured to select either the reference signal or the IF signal to be an input signal to a sub-sampling phase-locked loop (SSPLL), which generates a high-frequency output signal based on the input signal;
    wherein when the reference signal is the input signal to the SSPLL, the frequency synthesizer operates in a low-noise normal-operating mode in which the frequency synthesizer can become unlocked from a desired target frequency; an wherein when the IF signal is the input signal to the SSPLL, the frequency synthesizer operates in a higher-noise, frequency-acquisition mode in which the frequency synthesizer automatically locks to the target frequency;

feeding the IF signal and the high-frequency output signal into a sub-sampling lock detector (SSLD); and operating the SSLD, which involves,
- determining whether the frequency synthesizer becomes unlocked from the target frequency during the normal-operating mode, and if so, activating the switch to move the frequency synthesizer into the frequency-acquisition mode, and
- determining whether the frequency synthesizer becomes relocked to the target frequency during the frequency-acquisition mode, and if so, activating the switch to move the frequency synthesizer into the normal-operating mode.

12. The method of claim 11, wherein while operating the SSLD, the method determines a locking status of the frequency synthesizer, which involves:
- sampling the SSPLL output using the IF signal to produce a detection signal;
- measuring a frequency of the detection signal; and
- determining the locking status of the frequency synthesizer based on the frequency of the detection signal.

13. The method of 12, wherein the locking status can be one of the following:
- the SSPLL output signal is properly locked to a harmonic of the IF signal;
- the SSPLL output signal is improperly locked to a harmonic of the reference signal, which is not a harmonic of the IF signal; and
- the SSPLL output signal is not locked to any signal.

14. The method of claim 11, wherein the SSLD operates with reference to the IF signal and thereby consumes less power than a comparable circuit that operates at a higher frequency.

15. The method of claim 11, wherein the IF synthesizer comprises a phase-locked loop (PLL).

16. The method of claim 11, wherein the SSPLL comprises:
- a forward path, which feeds the IF signal through a sub-sampling phase detector (SSPD) to produce an error signal, wherein a charge pump converts the error signal into a voltage, which feeds through a loop filter and is used to tune a voltage-controlled oscillator to produce the high-frequency output signal;
- wherein during operation, the SSPD samples the reference signal using the high-frequency output signal to produce the error signal.

17. The method of claim 11, wherein operating the SSLD involves using a pseudo-digital state machine, which includes digital circuitry but is not driven by an external clock, to control activation of the switch.

18. An apparatus that includes a frequency synthesizer, comprising:
- an electronic system that uses a high-frequency output signal produced by the frequency synthesizer to control various operations performed by the electronic system;
- the frequency synthesizer, which is coupled to an electronic system, wherein the frequency synthesizer comprises:
  - an intermediate-frequency (IF) synthesizer that generates an IF signal based on a reference signal;
  - a sub-sampling phase-locked loop (SSPLL) that generates the high-frequency output signal based on an input signal;
  - a switch, which is configured to select either the reference signal or the IF signal to be the input signal to the SSPLL, wherein when the reference signal is the input signal to the SSPLL, the frequency synthesizer operates in a low-noise normal-operating mode in which the frequency synthesizer can become unlocked from a desired target frequency, and when the IF signal is the input signal to the SSPLL, the frequency synthesizer operates in a higher-noise, frequency-acquisition mode in which the frequency synthesizer automatically locks to the target frequency; and
  - a sub-sampling lock detector (SSLD), which is configured to:
    - determine whether the frequency synthesizer becomes unlocked from the target frequency during the normal-operating mode, and if so, to activate the switch to move the frequency synthesizer into the frequency-acquisition mode, and
    - determine whether the frequency synthesizer becomes relocked to the target frequency during the frequency-acquisition mode, and if so, to activate the switch to move the frequency synthesizer into the normal-operating mode.

19. The apparatus of claim 18, wherein the SSLD is configured to determine a locking status of the frequency synthesizer by:
- sampling the SSPLL output using the IF signal to produce a detection signal;
- measuring a frequency of the detection signal; and
- determining the locking status of the frequency synthesizer based on the frequency of the detection signal.

20. The apparatus of claim 18, wherein the electronic system comprises one of the following:
- a telecommunication system; and
- a computer system.

* * * * *